United States Patent [19]
Ariga et al.

[11] Patent Number: 5,492,593
[45] Date of Patent: Feb. 20, 1996

[54] PARTS FEEDER

[75] Inventors: Naotugu Ariga; Yukio Suzuki; Saburo Ogawa, all of Fukushima; Etuo Minamihama; Takayuki Akatsuka, both of Mie, all of Japan

[73] Assignees: Asahi Kogaku Kabushiki Kaisha, Tokyo; Kabushiki Kaisha Toshiba, Kanagawa; Japan Tobacco Inc., Tokyo; Asahi Kohki Co., Ltd., Fukushima, all of Japan

[21] Appl. No.: 259,978

[22] Filed: Jun. 17, 1994

[30] Foreign Application Priority Data

Jun. 18, 1993 [JP] Japan ................................ 5-147205

[51] Int. Cl.[6] ...................................... B32B 31/00
[52] U.S. Cl. .................... 156/584; 156/344; 221/73; 221/79
[58] Field of Search .................... 156/344, 584; 221/25, 71, 72, 73, 79; 226/5, 8, 52, 120; 414/411, 416

[56] References Cited

U.S. PATENT DOCUMENTS

| | | | |
|---|---|---|---|
| 4,494,902 | 1/1985 | Kuppens et al. | 156/584 X |
| 4,586,670 | 5/1986 | Vancelette et al. | 226/120 X |
| 4,735,341 | 4/1988 | Hamilton et al. | 221/1 |
| 4,740,136 | 4/1988 | Asai et al. | 414/416 X |
| 4,915,770 | 4/1990 | Haeda et al. | 156/344 |
| 5,116,454 | 5/1992 | Kurihara | 156/584 |
| 5,213,653 | 5/1993 | Akahori et al. | 156/584 |

FOREIGN PATENT DOCUMENTS

| | | |
|---|---|---|
| 0423599 | 4/1991 | European Pat. Off. . |
| 0523714 | 1/1993 | European Pat. Off. . |

*Primary Examiner*—Mark A. Osele
*Attorney, Agent, or Firm*—Sandler, Greenblum & Bernstein

[57] ABSTRACT

A parts feeder for feeding parts that are disposed on a carrier having a base tape and an adhesive tape. Parts are disposed above holes which are formed at equal intervals on the base tape, and the parts are held by an adhesive tape adhered to a lower surface of the base tape. The feeder includes a pitched feeding mechanism for intermittently feeding the carrier tape at a predetermined pitch, a separating mechanism for separating the adhesive tape from the base tape in synchronization with the feeding of the carrier tape at an adhesive tape separating stage, and a pressing mechanism for pressing the parts disposed on the base tape against the base tape prior to the separation of the adhesive tape from the base tape at the adhesive tape separating stage.

13 Claims, 8 Drawing Sheets

PARTS FEEDER

BACKGROUND OF THE INVENTION

1. Field of the Invention

The present invention relates to a parts feeder which conveys and feeds parts held by a carrier tape.

2. Description of Related Art

In a known parts feeder, parts to be conveyed are held on a carrier tape having a support tape (base tape) which is provided with holes spaced at an equidistance and an adhesive tape adhered to a lower surface of the support tape. The adhesive tape is adhered to the bottoms of the parts disposed on the holes to immovably hold the parts. Namely, the adhesive tape is bent into the holes of the support tape so that the adhesive tape can be adhered to the bottoms of the parts exposed to the through holes. In such a known parts feeder, when the adhesive tape is separated from the support tape, the connection between the parts and the adhesive tape is broken, so that the parts are merely disposed on the support tape without an adhesion thereto, thus resulting in a displacement of the parts from the support tape. To prevent this, the operation sequence was formulated such that the separation of the adhesive tape from the support tape takes place after a suction force is applied to the parts by a suction nozzle of a part mounting device. In this sequence, however, since no separation of the adhesive tape from the support tape can be effected until the parts are held by the suction device, the time intervals for feeding the parts are increased, resulting in an increased time for the feeding operation.

SUMMARY OF THE INVENTION

The primary object of the present invention is to provide a parts feeder using a carrier tape, wherein the time intervals of the parts feeding operation can be shortened.

The inventors of the present application have found that if the parts to be fed are pressed against the support tape of the carrier tape before the adhesive tape is separated or stripped from the support tape, the separation of the adhesive tape from the support tape can be carried out without waiting for the completion of a suction operation of the parts by the suction nozzle.

Namely, to achieve the object mentioned above, according to the present invention, there is provided a parts feeder for feeding parts that are disposed on a carrier tape comprising of a base tape and an adhesive tape, wherein the parts are disposed above holes which are formed at equal intervals on the base tape, and wherein the parts are held by an adhesive tape adhered to a lower surface of the base tape. The parts feeder includes a pitched feeding mechanism for intermittently feeding the carrier tape at a predetermined pitch, a separating mechanism for separating the adhesive tape from the base tape in synchronization with the feeding of the carrier tape at an adhesive tape separating stage, and a pressing mechanism for pressing the parts disposed on the base tape against the base tape prior to the separation of the adhesive tape from the base tape at the adhesive tape separating stage.

Preferably, the parts feeder includes a suction mechanism for applying a suction force to the surface of the base tape opposite the surface on which the parts are disposed in synchronization with the feeding of the carrier tape at the adhesive tape separating stage.

The separating mechanism can include, for example, a tape passage on which the carrier tape is fed, an adhesive tape separating hole provided on the tape passage through which the adhesive tape is fed when separated from the carrier tape and, a separating lever positioned below the separating hole, wherein the separating lever is swung in contact with the adhesive tape to separate the adhesive tape from the base tape.

The pressing mechanism can include, for example, a slider which is movable above the tape passage and in a direction parallel to the tape passage, a component holder which is pivoted with respect to the slider and capable of pressing the parts against the base tape when pivoted, wherein the component holder has a component holding leaf spring which contacts and presses the parts against the base tape, a moving device for moving the slider towards the separating hole, and a swinging mechanism for swinging the component holder towards the parts after the slider is moved a predetermined distance by the slider moving device so that the component holder presses the parts against the base tape.

The parts feeder may include a stopper, which restricts movement of the slider in a direction parallel to the tape passage after the slider has moved through the predetermined distance, wherein the component holder is swung by the force applied by the slider moving mechanism when movement of the slider is restricted; and a spring which biases the component holder away from the carriage tape.

The parts feeder preferably includes a single hydraulic device which actuates the pitched feeding mechanism, the separating mechanism, and the pressing mechanism. An adhesive tape winding mechanism for winding the adhesive tape after the tape is separated from the base tape may also be provided.

The pitched feeding mechanism preferably includes a pair of sprocket wheels which engage with a series of sprocket holes on opposite edges of the base tape, and a mechanism for rotating the pair of sprocket wheels in a manner such that the sprocket wheels rotate intermittently so that the base tape is moved intermittently.

According to another aspect of the present invention, there is provided a parts feeder for feeding parts that are disposed on a carrier tape consisting of a base tape and an adhesive tape, wherein the parts are disposed above holes which are formed at equal intervals on the base tape and held by an adhesive tape adhered to a lower surface of the base tape. The parts feeder includes a pitched feeding mechanism for intermittently feeding the carrier tape at a predetermined pitch, a separating mechanism for separating the adhesive tape from the base tape in synchronization with the feeding of the carrier tape at an adhesive tape separating stage, and a suction mechanism for applying a suction force to the surface of the base tape opposite the surface on which the parts are disposed in synchronization with the feeding of the carrier tape at the adhesive tape separating stage.

According to this aspect of the invention, it is preferable that the parts feeder include a pressing mechanism for pressing the parts disposed on the base tape against the base tape prior to the separation of the adhesive tape from the base tape at the adhesive tape separating stage.

The present disclosure relates to subject matter contained in Japanese patent application No. 5-147205 (filed on Jun. 18, 1993) which is expressly incorporated herein by reference in its entirety.

BRIEF DESCRIPTION OF THE DRAWINGS

The invention will be described below in detail with reference to the accompanying drawings, in which.

DESCRIPTION OF THE PREFERRED EMBODIMENT

Figure 8:
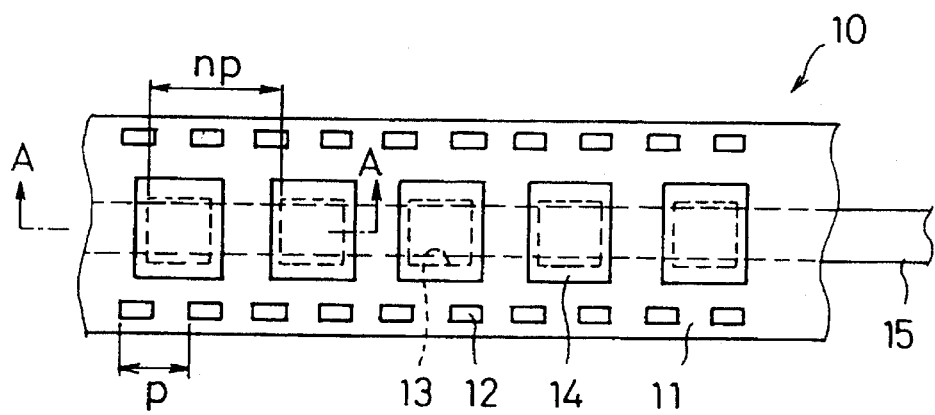
FIG. 8 is a plan view of a carrier tape used in a parts feeder according to the present invention, by way of example; and, FIG. 9 is a sectional view taken along the line A—A in FIG. 8.
Figure 9:
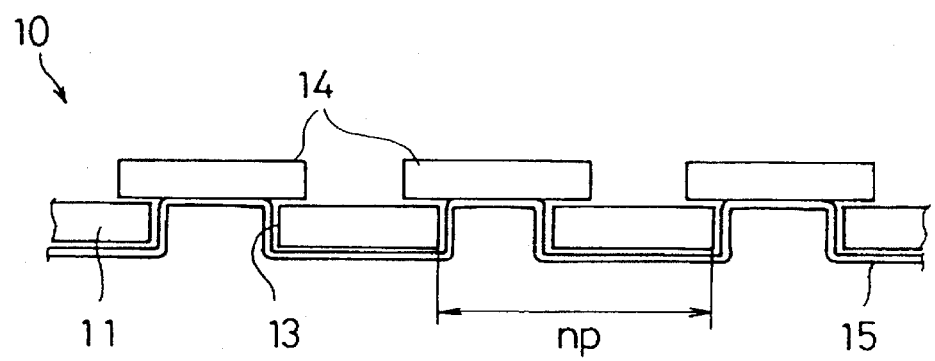

FIGS. 8 and 9 show a carrier tape 10 for the parts to be fed, used in a parts feeder according to the present invention. The carrier tape 10 comprises of a support tape (i.e., base tape) 11 which is provided on opposite side edges thereof with a number of sprocket holes (perforations) 12 which are equidistantly spaced at a distance p (e.g., p=4 mm). The support tape 11 is also provided with a number of through holes or openings 13 which are equidistantly spaced at a distance np (n=a natural number). Electronic components (parts to be fed) 14 are disposed on the through holes 13.

The carrier tape 10 has an adhesive tape 15 which is adhered to the lower surface of the support tape 11. The adhesive tape 15 is bent or deformed into the through holes 13, so that the adhesive tape 15 is adhered to the bottom surface of the electronic components 14 to immovably hold the same on the support tape 11. The value of "n" is predetermined depending on the size of the electronic components 14. The carrier tape 10 is wound about a tape reel 16 (FIG. 1) and is unwound therefrom to perform the feeding operation.

Figure 1:
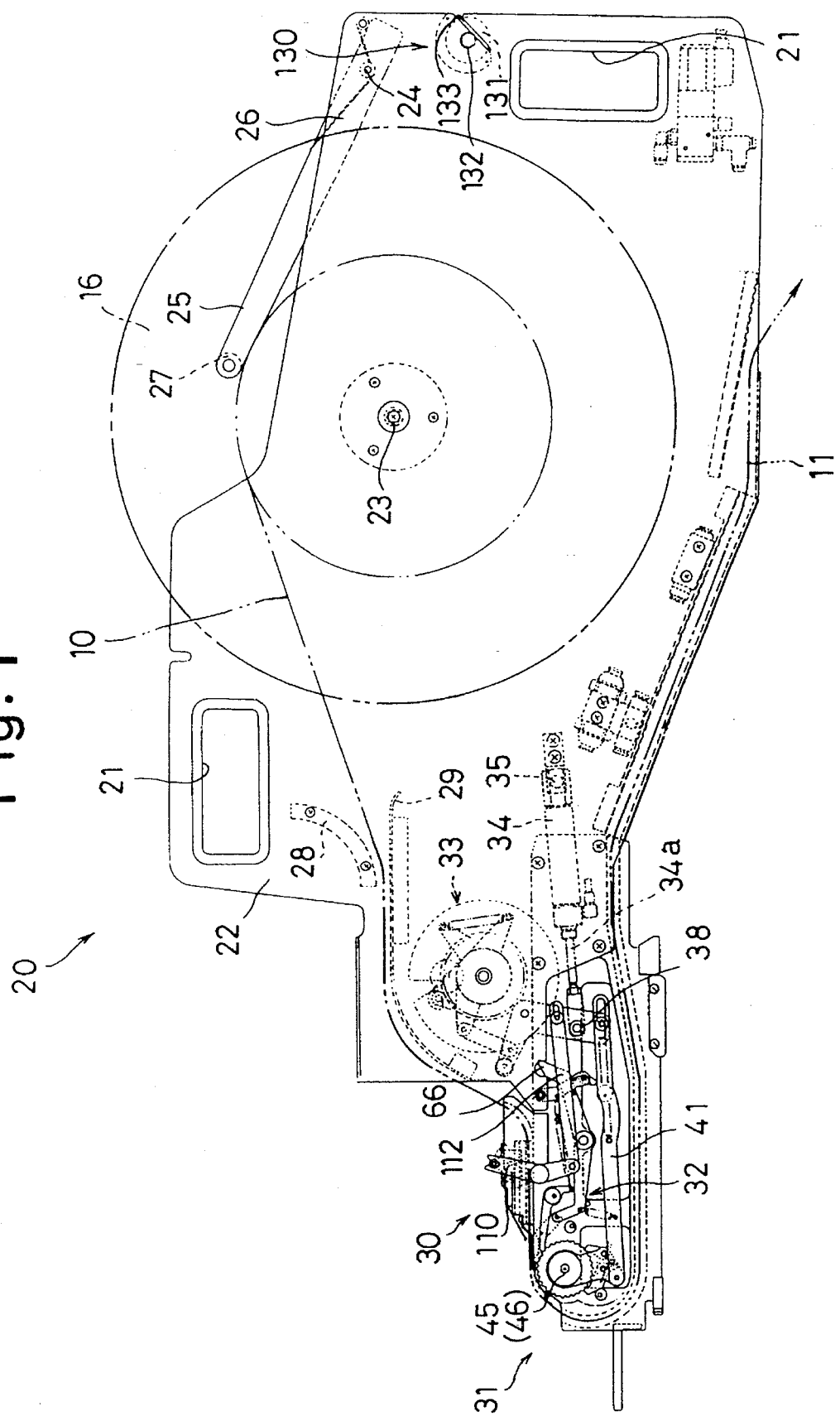
FIG. 1 is a front elevational view of a parts feeder according to an aspect of the present invention.

A portable parts feeder according to an aspect of the present invention is generally indicated at 20 in FIG. 1. All the components of the parts feeder 20 are supported by a frame 22 having a handle 21 which can be held by an operator who carries the same. A reel shaft 23 is provided in the frame 22 on the right portion (in FIG. 1) of the parts feeder to rotatably support the tape reel 16. On the right side of the reel shaft 23 is provided a reel keeping bar 25 pivoted on the frame 22 through a shaft 24. The reel keeping bar 25 is continuously biased by a torsion spring 26 toward the reel shaft 23. Consequently, a roller 27 provided at the front end of the reel keeping bar 25 comes into forceable contact with the outer peripheral surface of the carrier tape 10 regardless of the diameter of the carrier tape 10 wound about the tape reel 16.

The frame 22 is provided on the left portion (FIG. 1) thereof with immovable tape guide members 28 and 29 secured thereto to guide the carrier tape 10 fed from the tape reel 16. There are a pressing mechanism 30 of the parts, a pitched feeding mechanism 31 of the parts, and an adhesive tape separating mechanism 32, in front of the tape guide member 29. There is an adhesive tape winding mechanism 33 provided below the guide member 29. The pressing mechanism 30, the pitched feeding mechanism 31, the adhesive tape separating mechanism 32 and the adhesive tape winding mechanism 33 are driven by a single hydraulic cylinder device 34 which is rotatably supported on the frame 22 through a pivot shaft 35 at the rear end of the cylinder device 34. The carrier tape 10, the support tape 11, and the adhesive tape 15 are shown by a two-dotted and dashed line, a three-dotted and dashed line, and a four-dotted and dashed line, respectively, in FIGS. 1, 2, 4 and 6.

The pitched feeding mechanism 31 will be described below with reference to FIGS. 2 and 3.

The cylinder device 34 has a piston rod 34a which is pivoted through a pivot shaft 39 to an arm 38a of a crank lever 38 which is in turn pivoted on the frame 22 through a pivot shaft 37. The arm 38a is provided on the front end thereof with a pin 40 which is fitted in an elongated hole 41a formed at one end of a driving link 41. The other end of the driving link 41 is pivoted through a shaft 44 to a free end of a feed lever 43 pivoted to the frame 22 through a shaft 42. There is a tensile spring 36 between the pin 40 and the driving link 41, so that the pin 40 is normally brought into contact with one end of the elongated hole 41a.

A pair of right and left sprocket wheels 45 and a pair of right and left feed gears 46 that are integrally secured to the corresponding sprocket wheels 45 by calking pins 47 are rotatably and coaxially supported by the shaft 42. The sprocket wheels 45 are provided on the peripheral surfaces thereof with sprockets 45a which are spaced at an equiangular distance, so that the sprockets 45a can be engaged in the sprocket holes 12 of the carrier tape 10. The feed gears 46 have teeth 46a whose angular distance corresponds to the angular distance of the sprockets 45a.

The feed lever 43 is provided with a feeding pawl 48 and a positioning pawl 49. These pawls 48 and 49 are pivoted by respective shafts 50 and 51 to selectively engage with the teeth 46a of the feed gears 46. The feeding pawl 48 is biased by a biasing spring 52 in a direction to selectively engage at the front end thereof with the teeth 46a. The positioning pawl 49 is biased by a biasing spring 53 in a direction to be disengaged from the teeth 46a. The angular displacement of the feeding pawl 48 and the positioning pawl 49 is restricted by stop pins 54 and 55 provided on the frame 22.

Figure 3:
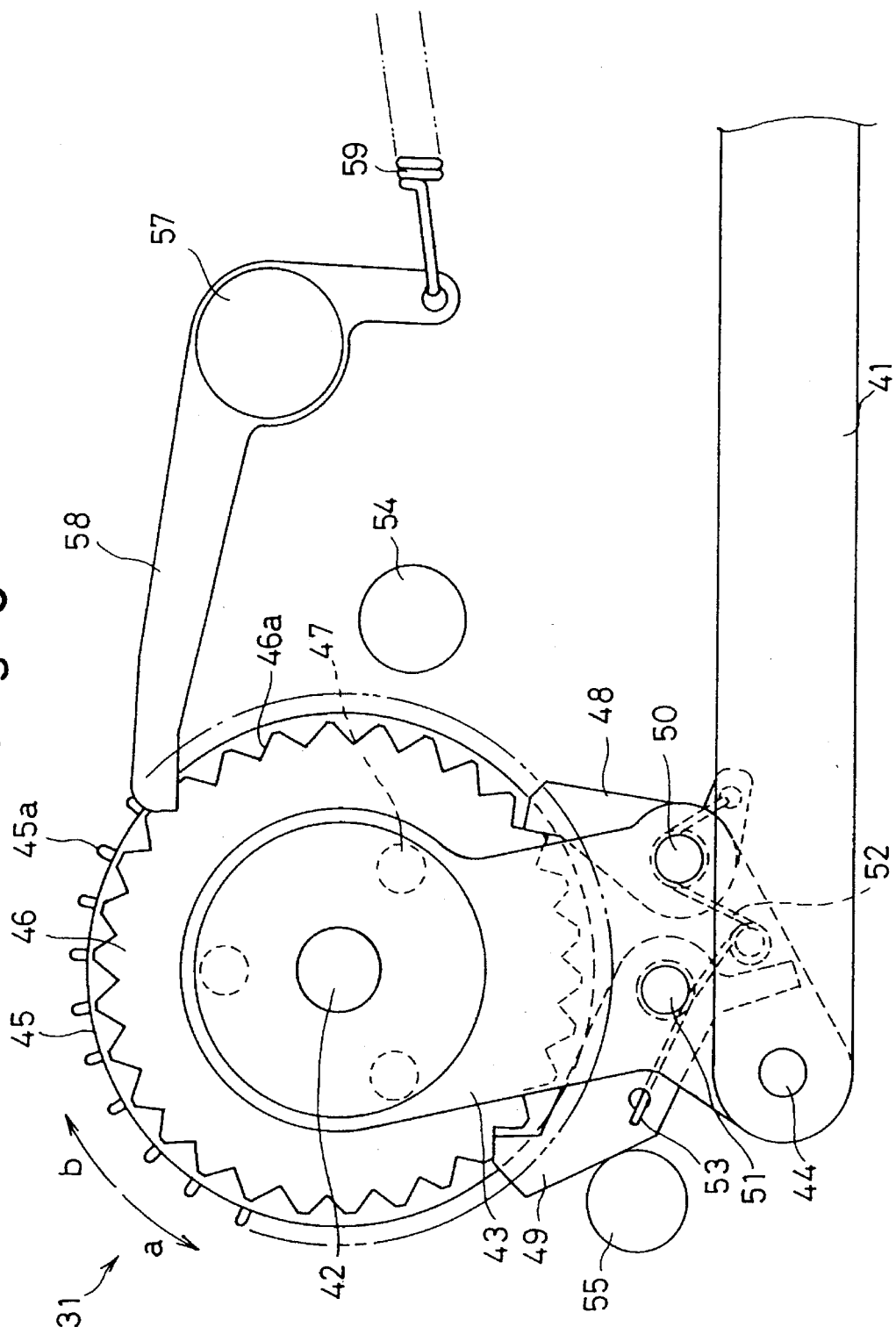
FIG. 3 is an enlarged front elevational view of a pitched feeding mechanism of a parts feeder according to the present invention.

As can be seen in FIG. 3, there is another positioning pin 58 pivoted on the frame 22 through a shaft 57. The front end of the positioning pawl 58 is continuously engaged in one of the teeth 46a of the feed gear 46 by the spring force of a tensile spring 59.

Figure 2:
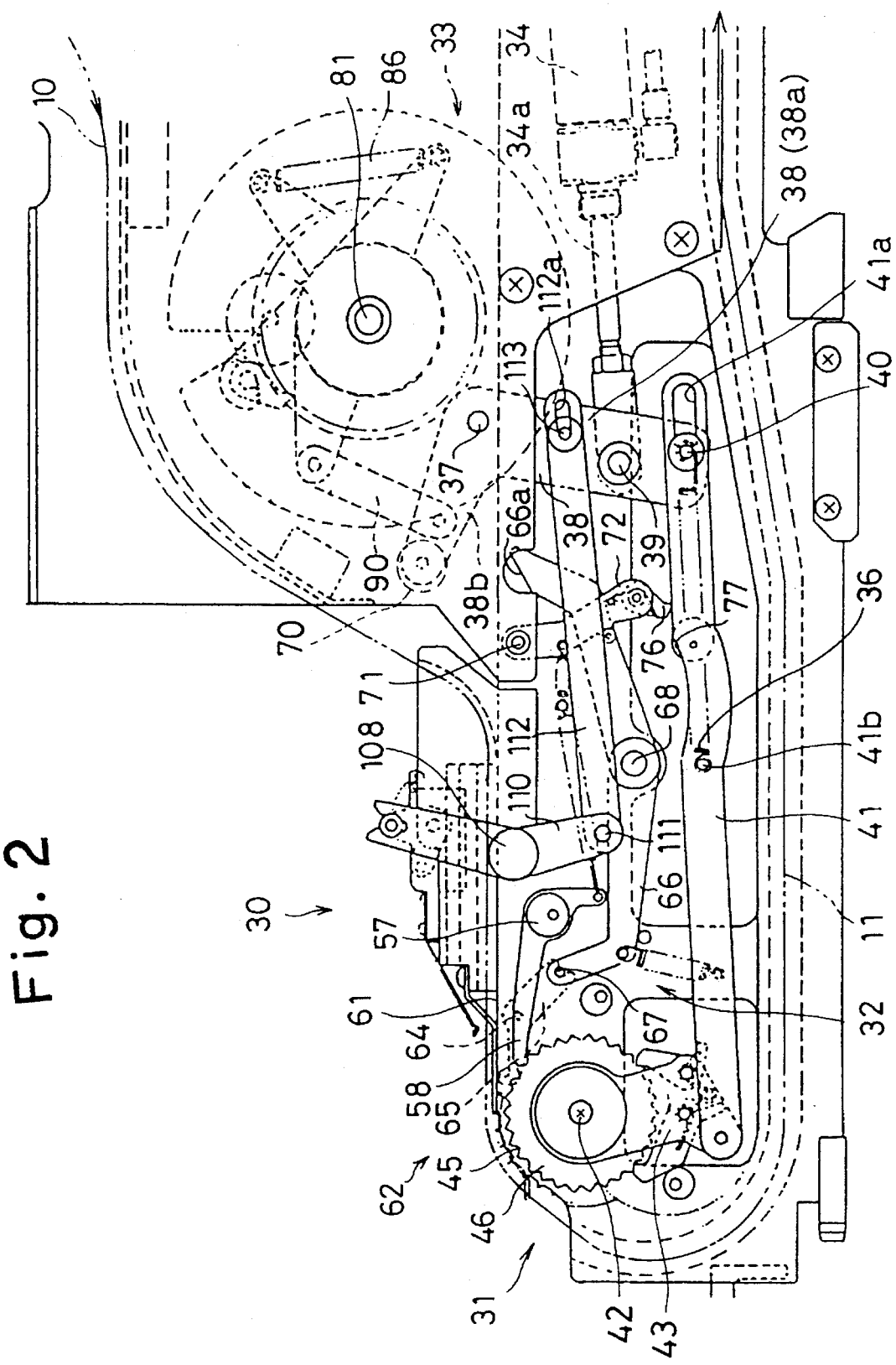
FIG. 2 is an enlarged front elevational view of a main part of a parts feeder according to the present invention.

In the pitched feeding mechanism 31 as constructed above, when the piston rod 34a of the cylinder device 34 is retracted or moved from the position shown in FIG. 2 (i.e., in the right direction in FIG. 2), the crank lever 38 is rotated about the shaft 37 in the counterclockwise direction. Consequently, the driving link 41 is moved backward by the spring force of the tensile spring 36 through the pin 40 and the spring engaging pin 41b, so that the feeding pawl 48 is moved in the same direction while engaging with one of the teeth 46a of the feed gears 46. The positioning pawl 49 is disengaged from the teeth 46a by the spring force of the biasing spring 53. Consequently, the feeding pawl 48 causes the feed gears 46 and the sprocket wheels 45 to rotate in the counterclockwise direction "a" through the associated teeth 46a. When the rotation of the feed gears 46 in the counterclockwise direction "a" occurs, the positioning pawl 58 successively rides over the teeth 46a. The largest displacement of the feeding pawl 48 is restricted by the stop pin 54, as mentioned above. Accordingly, a further backward movement of the piston rod 34a causes the pin 40 to move within the elongated hole 41a. The position at which the feeding pawl 48 abuts against the stop pin 54 corresponds to a position in which the carrier tape 10 is fed by a unit displacement by the sprockets 45a of the sprocket wheels 45, the rotation of which is restricted by the positioning pawl 58.

Thereafter, when the piston rod 34a is moved forward (i.e., in the left direction in FIG. 2), the driving link 41 is returned to the position shown in FIG. 3, so that the positioning pawl 49 comes into contact with the stop pin 55 and is rotated thereby. Consequently, the positioning pawl 49 engages with one of the teeth 46a of the feed gears 46. During the return of the driving link 41 to the initial position, the rotation of the feed gears 46 (in the clockwise direction "b") is restricted by the positioning pawl 58, and the feeding pawl 48 is returned to the initial position while riding over the teeth 46a. When the driving link 41 is returned, the positioning pawl 49 comes into engagement with one of the teeth 46a of the feed gears 46 to retain the driving link 41, and the feeding pawl 48, at a predetermined position.

Figure 4:
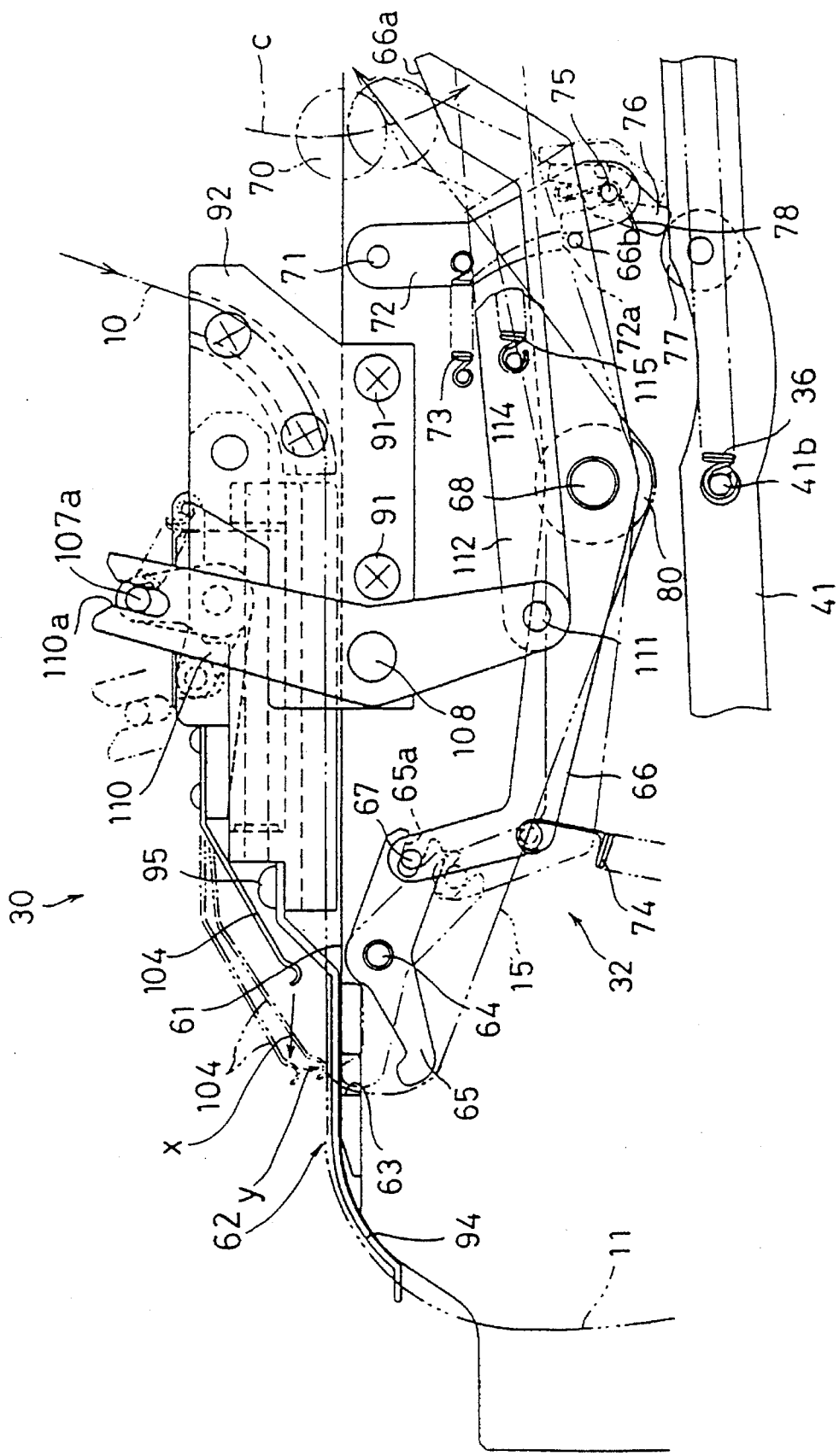
FIG. 4 is an enlarged front elevational view of a separation stage of an adhesive tape in a parts feeder according to the present invention.

The adhesive tape separating mechanism (apparatus) 32 will be discussed below with reference to FIGS. 2 and 4.

Figure 6:
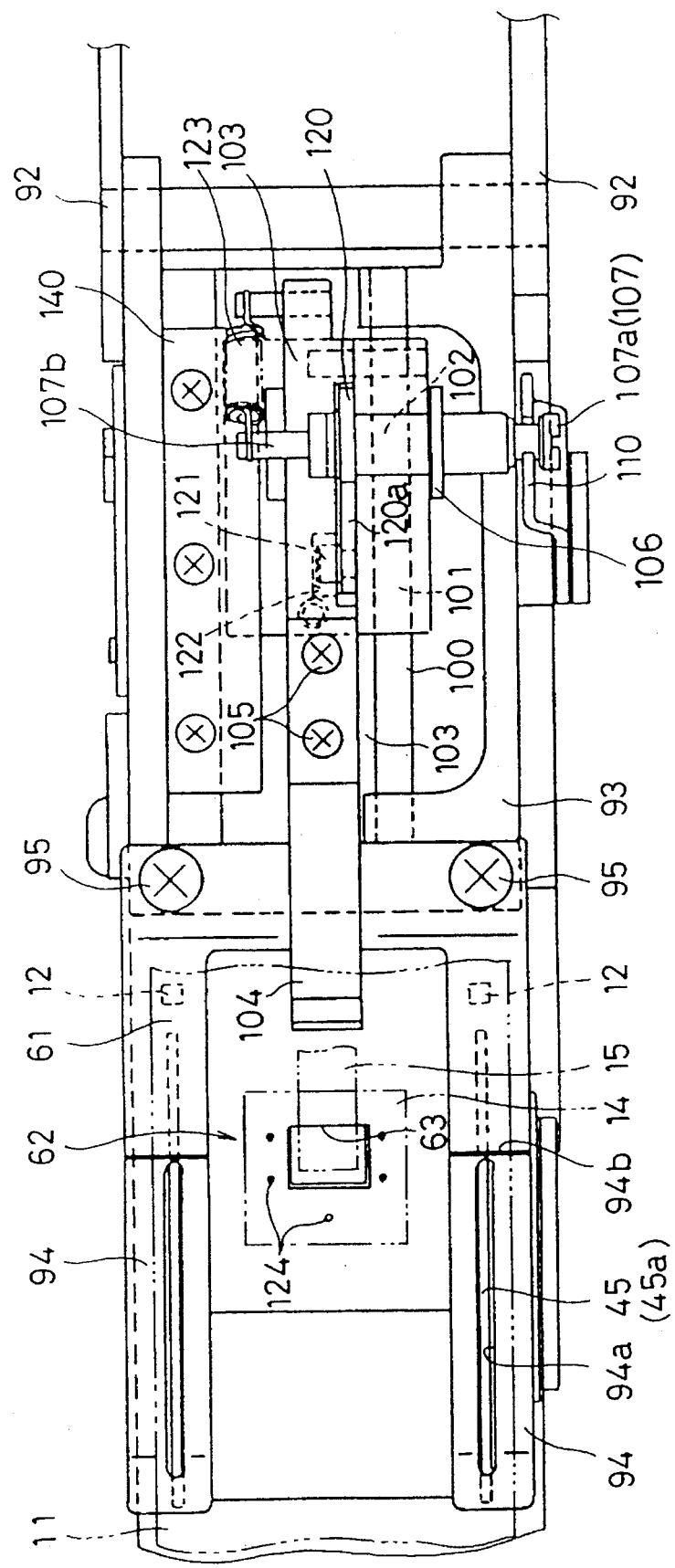
FIG. 6 is a plan view of FIG. 5.

The carrier tape 10 fed from the tape reel 16 is moved along and on a tape passage 61 formed on the upper surface of the frame 22, and comes to the adhesive tape separating stage (parts holding stage) 32 where the adhesive tape 15 is separated from the base tape. The tape passage 61 in the adhesive tape separating stage 62 is provided with an adhesive tape separating hole 63, as can be seen in FIGS. 4 and 6. A separating (or peeling) lever 65 is pivoted to the frame 22, through a shaft 64, below the adhesive separating hole 63. The separating lever 65 is provided on the rear end thereof with a bifurcated portion 65a in which a roller 67 is fitted. The roller 67 is provided on one end of a swing lever 66 which is pivoted on the frame 22 through a pivot shaft 68. The swing lever 66 is provided on the other end thereof with a striking surface 66a, to which an external force is applied in the direction C (FIG. 4), to rotate the swing lever 66 in the clockwise direction, so that the swing movement of the separating lever 65 (from a position shown by a phantom line to a position shown by a solid line) takes place through the roller 67 and the bifurcated portion 65a. Consequently, the adhesive tape 15 of the carrier tape 10 is separated from the base tape 11. The external force to be applied to the striking surface 66a in the direction C is produced by the roller 70 provided on the front end of the other arm 38b of the crank lever 38.

The separating lever 65 is moved to the separation waiting position shown at the phantom line before the roller 70 of the crank lever 38 strikes the striking surface 66a. To this end, an engaging lever 72 having an engaging stepped portion 72a, is pivoted on the frame 22 through a pivot shaft 71. A stop pin 66b is secured to the swing lever 66, and engaged in the engaging stepped portion 72a. The engaging lever 72 is continuously biased by a tensile spring 73 in a direction in which the stepped portion 72a is engaged by the stop pin 66b. Therefore, when the stop pin 66b is engaged in the stepped portion 72a, the swing lever 66 and the separating lever 65 are held in the position shown by solid lines in FIG. 4. Moreover, the swing lever 66 is continuously biased toward the separation waiting position by a tensile spring 74.

The engaging lever 72 is provided on the front end thereof with an auxiliary lever 76 pivoted with respect thereto, which is engaged by a roller 77 rotatably provided on the driving link 41. The auxiliary lever 76 is pushed by the roller 77, when the driving link 41 is retracted from the position shown in FIG. 4 (in the right direction) to swing the engaging lever 72. On the other hand, when the driving link 41 is advanced (in the left direction) while the roller 77 is located on the right side of the auxiliary lever 76, only the auxiliary lever 76 is rotated about the pivot shaft 75 without rotating the engaging lever 72.

In the adhesive tape separating mechanism 32 as constructed above, it is now assumed that the stepped portion 72a is engaged by the stop pin 66b of the swing lever 66. In this state, if the driving link 41 is moved rearward by the piston rod 34a, the roller 77 causes the engaging lever 72 to rotate in the counterclockwise direction about the pivot shaft 71 through the auxiliary lever 76. As a result, the engaging stepped portion 72a is disengaged from the stop pin 66b, so that the swing lever 66 is released from the engaging lever 72. Consequently, the swing lever 66 is moved by the tensile spring 74 from the position shown by the solid line to the position shown by a two-dotted and dashed line. The latter position corresponds to the separation waiting position.

When a further rearward movement of the piston rod 34a occurs, the crank lever 38 is rotated in the counterclockwise direction, and the roller 70 of the arm 38b thereof strikes the striking surface 66a. As a result, the swing lever 66 and the separating lever 65 are moved to the position shown by the solid line from the separation waiting position (two-dotted and dashed line position) to separate the adhesive tape 15 from the base tape 11 of the carrier tape 10. The separation of the adhesive tape is synchronous with the pitched feeding of the carrier tape 10, so that the separation takes place simultaneously with the feed of the carrier tape.

When the swing lever 66 is moved to the position shown by the solid line from the separation waiting position (two-dotted and dashed line position), the stepped portion 72a of the engaging lever 72, which is biased by the tensile spring 73 to rotate in the clockwise direction, is engaged by the stop pin 66b of the swing lever 66 to again hold the swing lever 66 in the position shown at the solid line. Thereafter, when the piston rod 34a is returned (advanced) and the driving link 41 is moved forward, the roller 77 of the driving link 41 pushes the auxiliary lever 76, so that the latter rotates about the pivot shaft 75 without swinging the engaging lever 72 and is then returned to the initial position by the spring force of the spring 78.

Figure 7:
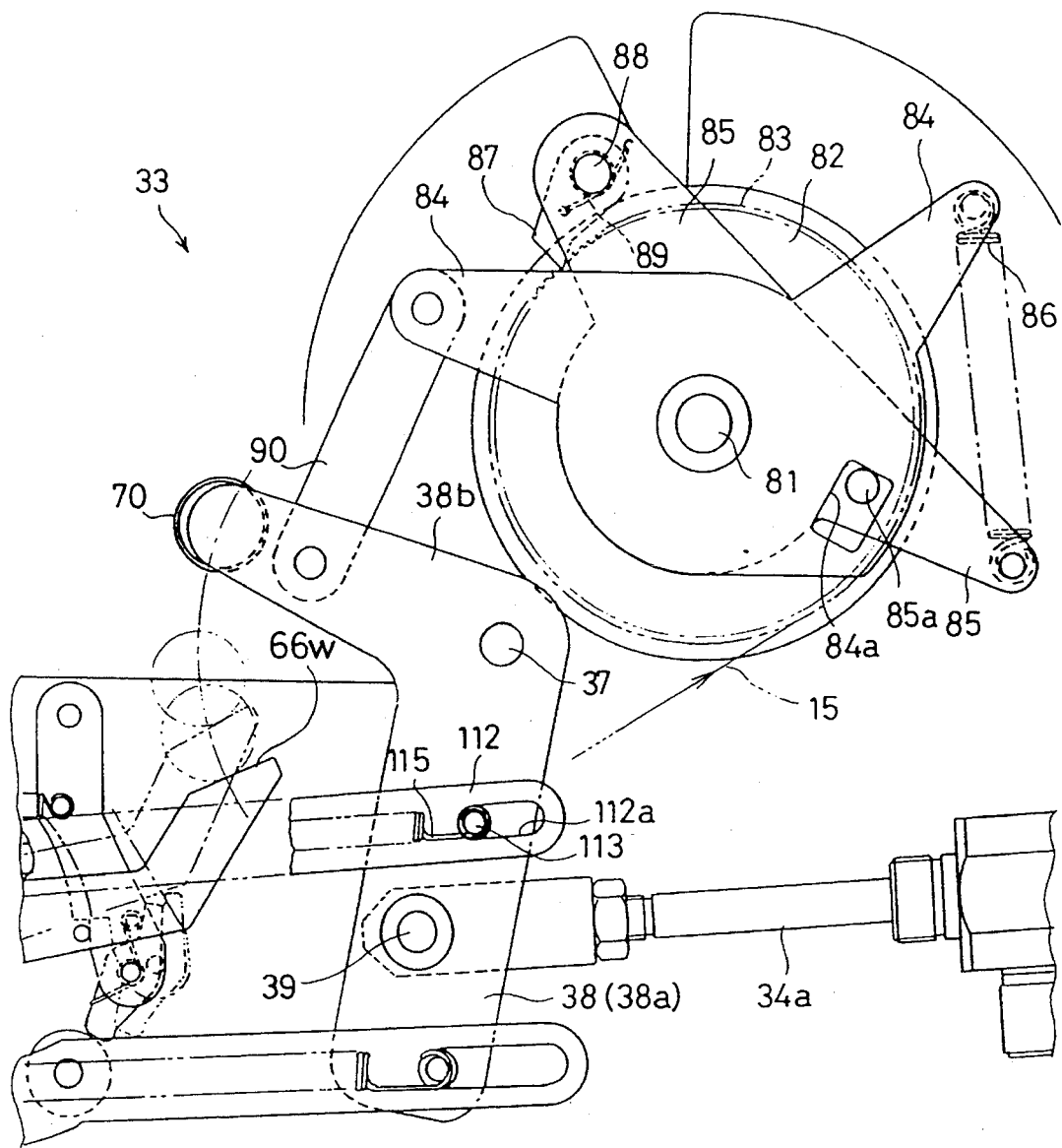
FIG. 7 is an enlarged front elevational view of an adhesive tape winding mechanism in a parts feeder according to the present invention.

The adhesive tape 15, separated from the base tape by the adhesive tape separating mechanism 32, is advanced towards the adhesive tape winding mechanism 33 through the guide roller 80 coaxial to the pivot shaft 68. The following discussion will be directed to the adhesive tape winding mechanism 33 with reference to FIGS. 2 and 7.

An adhesive tape winding shaft 81 is provided in the frame 22 to support a winding reel 82 through a one-way clutch so as to rotate in only one direction. A ratchet wheel 83 is secured to the winding reel 82. The adhesive tape winding shaft 81 coaxially supports a winding lever 84 and a ratchet lever 85. The winding lever 84 is provided with an opening 84a in which a pin 85a, secured to the ratchet lever 85, is fitted. The winding lever 84 and the ratchet lever 85 are relatively rotatable within an angular range defined by the circumferential width of the opening 84a. Namely, the winding lever 84 and the ratchet lever 85 can relatively rotate by an angular displacement defined by the space between the pin 85a and the opening 84a. The winding lever 84 and the ratchet lever 85 are biased by a tensile spring 86 to come close to each other, so that the pin 85a abuts against one end of the opening 84a.

The ratchet lever 85 is provided with a ratchet pawl 87 which pivots about a pivot shaft 88, so that the ratchet lever 85 engages with the ratchet wheel 83. The ratchet pawl 87 is continuously biased by a torsion spring 89 in a direction to engage with the ratchet wheel 83. The ratchet pawl 87 transmits the rotation of the ratchet lever 85 in the counterclockwise direction to the ratchet wheel 83, and accordingly, the winding reel 82, but does not transmit the rotation of the ratchet lever 85 in the clockwise direction.

The winding lever 84 is rotatably connected to the arm 38b of the crank lever 38 through a link 90, so that when the piston rod 34a is retracted, the winding lever 84 is rotated in the counterclockwise direction. When the rotation of the winding lever 84 in the counterclockwise direction takes place, the ratchet lever 85 is rotated together with the winding lever 84 by the force of the tensile spring 86, so that the ratchet pawl 87 rotates the winding reel 82 in the counterclockwise direction through the ratchet wheel 83. Thus, the adhesive tape 15 is wound about the winding wheel 82. The tensile spring 86 is tensed so that the winding lever 84 is movable with respect to the ratchet lever 85 when there is a load above a predetermined value on the rotation of the ratchet lever 85. When the piston rod 34a is moved forward, the winding lever 84 is rotated in the clockwise direction, so that the winding lever 84 rotates in the same direction through the engagement of the pin 85a with the opening 84a. During this rotation, the ratchet pawl 87 rides over the ratchet wheel 83 and idles with respect to the winding reel 82.

The pressing mechanism 30 presses the electronic components 14 against the base tape 11 so that the components 14 will not move with respect to the base tape 11 during the separation of the adhesive tape 15 from the base tape 11. The pressing mechanism 30 will be discussed below with reference to FIGS. 4 through 6.

A pair of right and left mounting plates 92 are secured to the frame 22 through screws 91 in the vicinity of the tape passage 61. Between the mounting plates 92 is secured a casing 93 to which a guide bar 100 extending in the direction of the travel of the carrier tape 10 is secured. An arched guide 94 is secured to the front end of the casing 93 by securing screws 95, and lies along and above the right and left sprocket wheels 45 of the pitched feeding mechanism 31 to prevent the upward movement (floating or flapping) of the carrier tape during the movement along and on the tape passage. The arched guide 94 is provided with grooves 94a, from which the sprockets 45a of the sprocket wheels 45 project, to prevent base tape 11 of the carrier tape 10 from being disengaged upward from the sprocket wheels 45. The guide 94 bears guide marks 94b thereon which are adapted to determine the initial position of the electronic components 14, as shown in FIG. 6. The casing 93 is provided on the lower portion thereof with a tape passage 96 in which the carrier tape 10 travels.

The guide bar 100 slidably supports a slider 101. The slider 101 is provided with an electronic component holder 103 that pivots about a shaft 102. The electronic component holder 103 has an electronic component keeping spring 104 which is secured thereto by securing screws 105, and which extends above the adhesive tape separating stage 62. The shaft 102 is provided on one end thereof with a first radial arm 106 secured thereto, and on the other end with a second radial arm 120. A pin 107 extends through the front ends of the radial arms 106 and 120. One end 107a of the pin 107 is fitted in a bifurcated portion 110a provided at one end of a driving lever 110 which is pivoted on the frame 22 through a shaft 108. A movement transmitting link 112 is rotatably connected at one end thereof to the other end of the driving lever 110 through a shaft 111. The movement transmitting link 112 is provided on the other end with an elongated hole 112a (FIG. 2), in which a pin 113 provided on the crank lever 38 is fitted. A spring 115 (FIG. 7) is provided between the pin 113 and a spring connecting pin 114 provided on the movement transmitting link 112.

Figure 5:
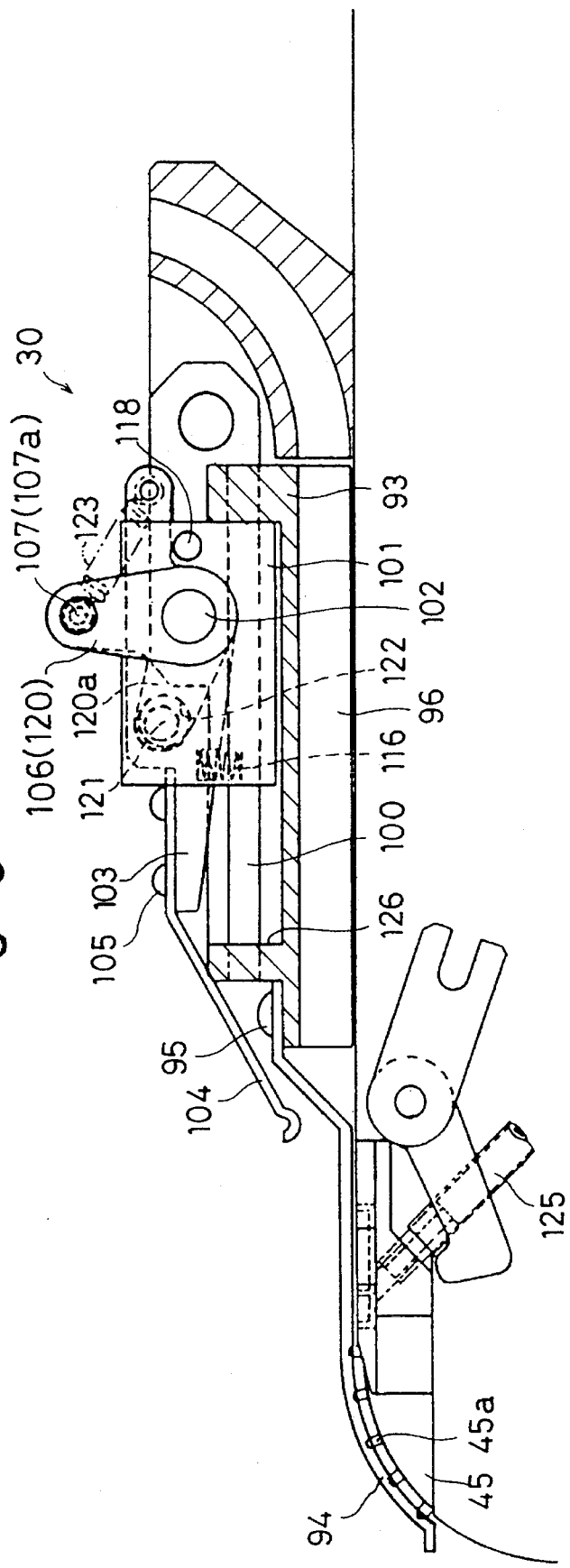
FIG. 5 is an enlarged front elevational view of a pressing mechanism of parts in a parts feeder according to the present invention.

The electronic component holder 103, which is swingable about the shaft 102 with respect to the slider 101, is continuously biased by a compression spring 116, provided between the lower surface of the electronic component holder 103 and the upper surface of the slider 101, in the clockwise direction shown in FIG. 5. The angular displacement of the electronic component holder 103 is restricted by a stop pin 118, provided on the slider 101. The second radial arm 120 is provided with a radially extending lever portion 120a integral therewith, at an axial position different from the axial position of the first radial arm 106. The lever portion 120a is provided on the front end thereof with an association pin 121 which is engaged in an association groove 122 formed in the electronic component holder 103. A tensile spring (return spring) 123 is provided between the other end 107b of the pin 107 and the electronic component holder 103 to rotate and return the pin 107 about the shaft 102 in the clockwise direction. Numeral 140 designates a guide which holds the slider 101 between the guide 140 and the casing 93 to restrict the rotation of the slider 101.

The adhesive tape separating stage 62 is provided with a plurality of vacuum suction holes 124 (FIG. 6) surrounding the adhesive tape separating opening 63 to suction the base tape (support tape) 11 from which the adhesive tape 15 has been separated. The vacuum suction holes 124 are connected to a vacuum suction pipe 125 to supply the vacuum suction holes 124 with vacuum (negative pressure), as shown in FIG. 5.

In the pressing mechanism 30 as constructed above, when the crank lever 38 is rotated in the counterclockwise direction by the rearward movement of the piston rod 34a, the movement transmitting link 112 is moved rearward through the pin 113, so that the driving lever 110 is rotated in the counterclockwise direction about the shaft 108. As a result, the slider 101 which supports the electronic component holder 103 moves forward along the guide bar 100. When the slider 101 comes into contact with the stop surface 126 of the casing 93, no further movement of the slider 101 occurs, but the driving lever 110 continues rotating. Consequently, the rotation of the radial arms 106 and 120 about the shaft 102 in the counterclockwise direction takes place, so that the association pin 121 of the lever portion 120a pushes the electronic component holder 103 through the end surface of the association groove 122. Namely, the electronic component holder 103 to which the rotational force is applied is rotated about the shaft 102 in the counterclockwise direction.

Consequently, the electronic component keeping spring 104, secured to the electronic component holder 103, is translated along the adhesive tape separating stage 62 until the slider 101, which moves along the guide bar 100 comes into contact with the stop surface 126. The rotation of the electronic component holder 103 about the shaft 102 in the counterclockwise direction takes place after the slider 101 abuts against the stop surface 126 which in turn causes the electronic component keeping spring 104 to move toward the adhesive tape separating stage 62, so that the electronic component 14 on the base tape 11 can be held by the front end of the electronic component keeping spring 104. The above-mentioned movement of the electronic component keeping spring 104 is indicated at arrows "x" and "y" in FIG. 4, respectively. Thus, the electronic components 14 can be prevented from being displaced on the base tape 11. In the present invention, the sequence of the operations is controlled such that the keeping operation of the electronic components 14 by the electronic component keeping spring 104 is effected immediately before the adhesive tape 15 is separated from the base tape by the adhesive tape separating mechanism 32. Accordingly, it is possible to commence the separation of the adhesive tape from the base tape even before the associated electronic component 14 is suctioned by the chip mounting device (not shown), i.e., without awaiting the completion of the suction operation of the electronic components 14 by the chip mounting device. The suction operation of the electronic components 14 by the chip mounting device can be optionally carried out at an appropriate time after the electronic components 14 are firmly held by the electronic component keeping spring 104.

It is preferred that a shaft of the roller 70 is eccentric with regard to the center of the roller, so that the time at which the roller 70 strikes the striking surface 66a of the swing lever 66 is adjusted by changing the direction of the roller 70 about the axis and securing the roller to the arm 38b.

The vacuum suction holes 124, which are connected to the vacuum suction pipe 125, suction the base tape 11 at a time different from the time at which the pitched feeding mechanism 31 intermittently feeds the carrier tape 10. Consequently, no accidental movement of the base tape 11 occurs when the electronic components 14 are held by the pressing mechanism (holding mechanism) 30 or the adhesive tape 15 is separated from the adhesive tape separating mechanism 32, thus resulting in not only a stable keeping operation of the electronic components 14, but also a stable separation of the adhesive tape 15.

Numeral 130 in FIG. 1 designates a cutter for the base tape 11. The cutter 130 has a circular blade 131 which is rotatably supported by the frame 22 through a shaft 132. The frame 22 is provided with a groove 133 in which the circular blade 131 opens. Consequently, the base tape 11 which is inserted in the groove 133 can be cut by the circular blade 131.

As can be seen from the above discussion, according to the present invention, the parts disposed on the base tape can be firmly held on the base tape before the adhesive tape is separated from the base tape, and accordingly, the separation of the adhesive tape from the base tape can be carried out before the parts are suctioned by the chip mounting device, i.e., without awaiting the completion of the suction operation of the parts by the chip mounting device. Consequently, the feeding interval (time) of the parts can be shortened.

We claim:

1. A parts feeder for feeding parts that are disposed on a carrier tape comprising: a base tape and an adhesive tape, wherein the parts are disposed above holes which are formed at equal intervals on the base tape, and wherein the parts are held by the adhesive tape adhered to a lower surface of the base tape;

a pitched feeding means for intermittently feeding said carrier tape at a predetermined pitch;

means for separating the adhesive tape from the base tape in synchronization with the feeding of the carrier tape at an adhesive tape separating stage; and means for pressing the parts disposed on the base tape against the base tape prior to the separation of the adhesive tape from the base tape at the adhesive tape separating stage.

2. The parts feeder of claim 1, further comprising:

a suction means for applying a suction force to a surface of the base tape opposite a surface on which the parts are disposed, in synchronization with the feeding of the carrier tape at the adhesive tape separating stage.

3. The parts feeder of claim 1, wherein said separating means comprises:

a tape passage on which said carrier tape is fed;

an adhesive tape separating hole, provided on said tape passage, through which the adhesive tape is fed when separated from the carrier tape; and a separating lever positioned below said separating hole, said separating lever swung in contact with the adhesive tape to separate the adhesive tape from the base tape.

4. The parts feeder of claim 2, wherein said pressing means comprises:

a slider which is movable above said tape passage and in a direction parallel to said tape passage;

a component holder which is pivoted with respect to said slider, said component holder capable of pressing said parts against said base tape when pivoted;

means for moving said slider towards said separating hole; and means for swinging said component holder towards the parts after said slider is moved a predetermined distance by said slider moving means so that the component holder presses the parts against the base tape.

5. The parts feeder of claim 4, wherein said component holder has a component holding leaf spring which contacts and presses the parts against the base tape.

6. The parts feeder of claim 4, further comprising:

a stopper which restricts movement of said slider in a direction parallel to said tape passage after said slider has moved through said predetermined distance, wherein said component holder is swung by the force applied by said slider moving means when movement of said slider is restricted by said stopper.

7. The parts feeder of claim 6, further comprising:

a spring which biases said component holder away from said carriage tape.

8. The parts feeder of claim 1, further comprising:

a single hydraulic device which actuates said pitched feeding means, said separating means, and said pressing means.

9. The parts feeder of claim 1, further comprising: an adhesive tape winding means which winds the adhesive tape after the tape is separated from the base tape.

10. The parts feeder of claim 9, further comprising:

a single hydraulic device which actuates said pitched feeding means, said separating means, said pressing means, and said adhesive tape winding means.

11. The parts feeder of claim 1, wherein the base tape has a series of sprocket holes on opposite edges thereof.

12. The parts feeder of claim 11, wherein said pitched feeding means comprises:

a pair of sprocket wheels which engages said series of sprocket holes; and, means for rotating said pair of sprocket wheels in a manner such that the sprocket wheels rotate intermittently so that the base tape is moved intermittently.

13. A parts feeder for feeding parts that are disposed on a carrier tape comprising a base tape and an adhesive, wherein the parts are disposed above holes which are formed at equal intervals on the base tape and held by the adhesive tape adhered to a lower surface of the base tape, comprising:

means for separating the adhesive tape from the base tape in synchronization with the feeding of the carrier tape at an adhesive tape separating stage;

means for pressing the parts disposed on the base tape against the base tape prior to the separation of the adhesive tape from the base tape at said adhesive tape separating stage; and a suction means for applying a suction force to the surface of the base tape, opposite a surface on which the parts are disposed, in synchronization with the feeding of the carrier tape at said adhesive tape separating stage.

* * * * *

UNITED STATES PATENT AND TRADEMARK OFFICE
CERTIFICATE OF CORRECTION

PATENT NO. : 5,492,593
DATED : February 20, 1996
INVENTOR(S) : N. ARIGA et al.

It is certified that error appears in the above-indentified patent and that said Letters Patent is hereby corrected as shown below:

On title page, item [73], "Assignees", line 1, after "Kogaku" insert ---Kogyo---.

Signed and Sealed this

Eighteenth Day of June, 1996

Attest:

BRUCE LEHMAN

Attesting Officer         Commissioner of Patents and Trademarks